United States Patent [19]

Iwamatsu

[11] 4,231,657
[45] Nov. 4, 1980

[54] LIGHT-REFLECTION TYPE PATTERN FORMING SYSTEM

[75] Inventor: Seiichi Iwamatsu, Tokyo, Japan

[73] Assignee: VLSI Technology Research Association, Japan

[21] Appl. No.: 22,848

[22] Filed: Mar. 22, 1979

[30] Foreign Application Priority Data

Mar. 27, 1978 [JP] Japan ................................. 53/34157

[51] Int. Cl.³ ............................................ G03B 27/72
[52] U.S. Cl. ........................................ 355/71; 355/77
[58] Field of Search .................... 355/71, 77, 40, 67

[56] References Cited
U.S. PATENT DOCUMENTS

| | | | |
|---|---|---|---|
| 3,579,338 | 5/1971 | Ooue et al. ........................ | 355/70 X |
| 4,115,003 | 9/1978 | Nachtrieb ......................... | 355/77 X |

Primary Examiner—Richard A. Wintercorn
Attorney, Agent, or Firm—Craig & Antonelli

[57] ABSTRACT

A light-reflection type pattern forming system used in the process for producing semiconductor devices. The system comprises a light source, a light-reflection type mask having a highly reflective region with a desired pattern on its surface, and an object to be exposed by the light reflected from said highly reflective region. The reflected light contains the information about the desired pattern and the desired pattern is copied on the object. Since this constitution uses reflected light instead of transmitted light, the absorption of light can be prevented and also the restriction on the range of wavelengths of the light from the source can be removed. The part of the incident light cast on the region other than the highly reflective region is absorbed, irregularly reflected or diverted so as not to expose the object.

15 Claims, 34 Drawing Figures

FIG. 8A-I
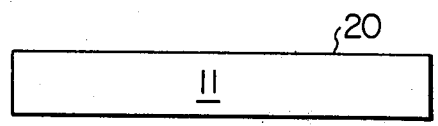
FIG. 8B-I
FIG. 8A-II
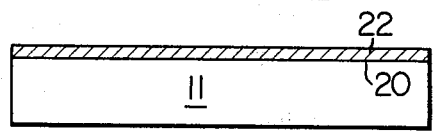
FIG. 8B-II
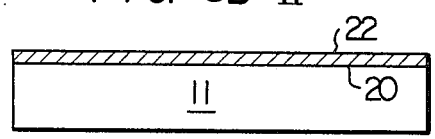
FIG. 8A-III
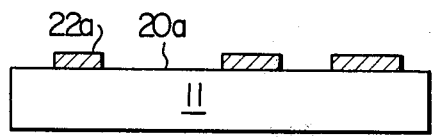
FIG. 8B-III
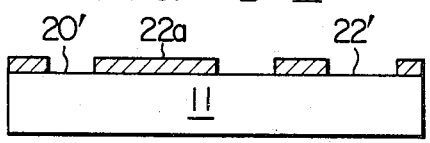
FIG. 8A-IV
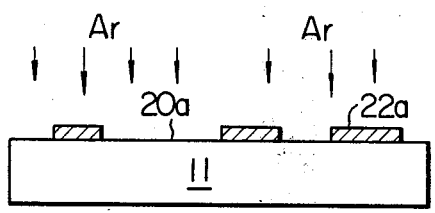
FIG. 8B-IV
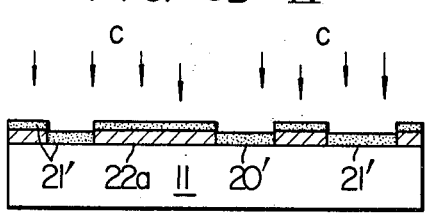
FIG. 8A-V
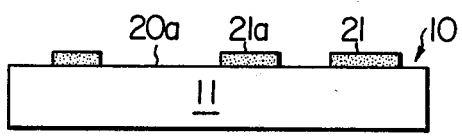
FIG. 8B-V
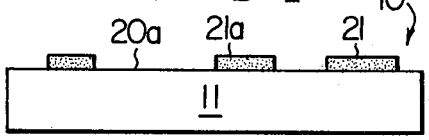

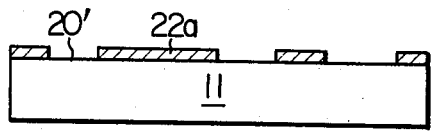
FIG. 9A-I
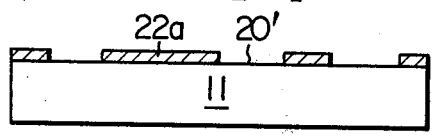
FIG. 9B-I
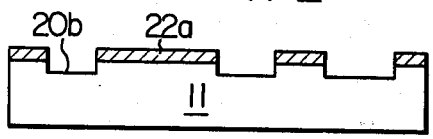
FIG. 9A-II
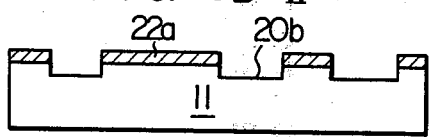
FIG. 9B-II
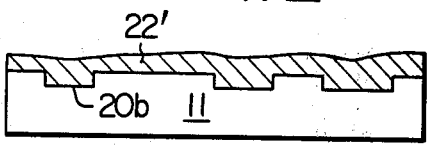
FIG. 9A-III
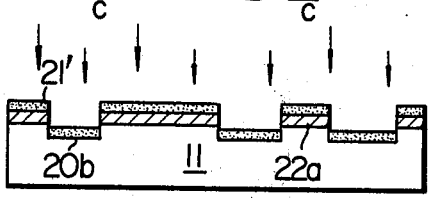
FIG. 9B-III
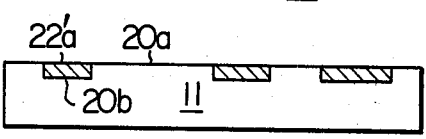
FIG. 9A-IV
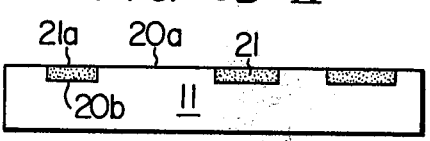
FIG. 9B-IV
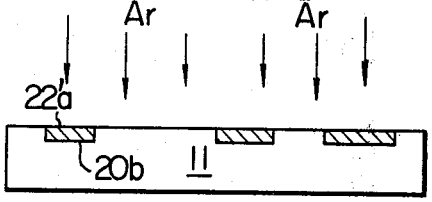
FIG. 9A-V
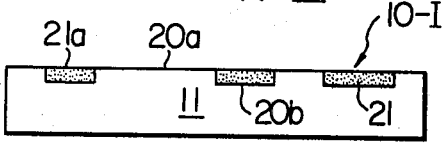
FIG. 9A-VI

LIGHT-REFLECTION TYPE PATTERN FORMING SYSTEM

BACKGROUND OF THE INVENTION

This invention relates to a technique for copying patterns, used widely in the process of producing semiconductor devices, and more particularly to a light-reflection type pattern forming system using a light-reflection type mask instead of the conventional light-transmission type mask.

In the conventional technique for forming patterns, using a light-transmission type mask, a wafer comprising a silicon substrate and a film of silicon oxide formed thereon is used as an exposed object and the silicon oxide film is subjected to a photoetching process to cut a gap of desired pattern in the silicon oxide film. For this purpose, a photoresist layer is deposited on the silicon oxide film. In addition, an opaque material such as an emulsion layer is deposited on a transparent substrate in a pattern similar to an original pattern. Light is then passed through the part of the transparent substrate not covered by the opaque pattern onto the photoresist layer and causes a photochemical reaction in the corresponding part of the photoresist film so that a desired pattern similar to the original one is copied on the exposed object. These are the preparatory steps for the etching which is to follow.

However, the conventional light-transmission type pattern copying technique described above has the following inherent drawbacks.

In general, a glass plate is used as the transparent substrate for the light-transmission type mask. However, the light used to cause a photochemical reaction or an exposing effect is necessarily absorbed by the transparent material. The degree of the absorption increases with the decrease in the wavelength of the exposing light. Accordingly, the range of the wavelength of available light which may be used for this process is limited to prevent too much absorption and moreover even if the light having a range of wavelengths exhibiting a high transmissivity is used for exposure, the exposure time required to form a desired pattern in the photoresist layer is too long owing to the loss of exposing light through absorption by the transparent material. For example, if a pattern copying process is carried out in which deep ultra-violet light, considered favorable for a micro-pattern, is projected through a light-transmission type mask using a transparent substrate of ordinary glass, almost the entire quantity of the projected light is absorbed and the light which pentrates the glass is almost nonexistent. As a result, it is not merely a matter of the above described photochemical reaction, i.e. exposure reaction, requiring too much time, but rather that the reaction never takes place. Even in the case where quartz glass or saphire is used for the transparent substrate, the transmittivity to the deep ultra-violet light is at best 50%.

SUMMARY OF THE INVENTION

One object of this invention is to provide a light-reflection type pattern forming system in which an exposed object is irradiated by the light reflected from the mask.

Another object of this invention is to provide a light-reflection type pattern forming system having a highly reflective region on the surface of the mask.

Yet another object of this invention is to provide a light-reflection type pattern forming system in which the intensity of the light reflected from the part of the surface of the mask other than the highly reflective region is low.

A furthr object of this invention is to provide a light-reflection type pattern forming system in which the light reflected from the part of the surface of the mask other than the highly reflective region is prevented from being cast on the exposed object.

The light-reflection type pattern forming system according to this invention comprises a light source, a light-reflection type mask having on one of its main surfaces a highly reflective region which has a desired shape and reflects the light emitted from the light source in a predetermined direction, and an exposed object irradiated by the light reflected from the highly reflective region. Accordingly, the light reflected from the highly reflective region contains the information corresponding to the desired pattern. According to the light-reflection type pattern forming system, therefore, the absorption of light by the mask can be prevented so that exposure efficiency is improved and so that the deep ultra-violet light, not available in the conventional system, can be utilized.

The highly reflective region of the light-reflection type mask according to this invention may comprise, for example, a light-reflection type mask substrate having a mirror surface and a material deposited on the mirror surface which has a high light-absorptivity. The highly absorptive material forms a low reflective region and the light reflected from the low reflective region contributes nothing to the photochemical reaction in the surface of the exposed object. Moreover, the mask substrate may be formed of a material having a high light-absorptivity and a highly reflective material may be deposited on the substrate. Further, such a light-reflection type mask may comprise a mask substrate of transparent material, a highly reflective material deposited on one of the two main surfaces of the mask substrate, and a layer of a highly light-absorptive material coated on the other main surface of the substrate. In this case, the light reflected from the highly absorptive layer is attenuated and contributes nothing to exposure. Instead of the highly absorptive layer, there may be provided a highly reflective means to divert the light having penetrated the substrate to a direction remote from the exposed object.

BRIEF DESCRIPTION OF THE DRAWINGS

FIGS. 8A-I-V and 8B-I-V show the steps of two processes for producing such a mask as shown in FIG. 6.

FIGS. 9A-I-VI and 9B-I-IV show the steps of two processes for producing such a mask as shown in FIG. 7.

DESCRIPTION OF THE PREFERRED EMBODIMENTS

Figure 1:
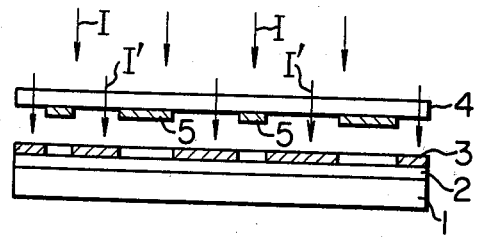
FIG. 1 illustrates the operating principle of a conventional light-transmission type pattern forming apparatus.

Before the description of the embodiments of this invention, the conventional light-transmission type pattern forming apparatus mentioned above will be briefly explained with the aid of FIG. 1 of the attached drawings.

As shown in FIG. 1, an exposed object comprises a silicon substrate 1, a silicon oxide film 2 and a photoresist layer 3. A light-transmission type mask including a transparent substrate 4 and a light-shielding material 5 provided on one of the main surfaces of the substrate 4, is placed in the path of the light impinging onto the exposed object. The light I' having passed through the transparent substrate 4 causes a photochemical reaction in the corresponding parts of the photoresist layer 3 so that an original pattern is copied. This light-transmission type pattern forming apparatus has such drawbacks as described before.

Now, this invention will be described by way of various embodiments with the aid of FIGS. 2 through 13.

Figure 2:
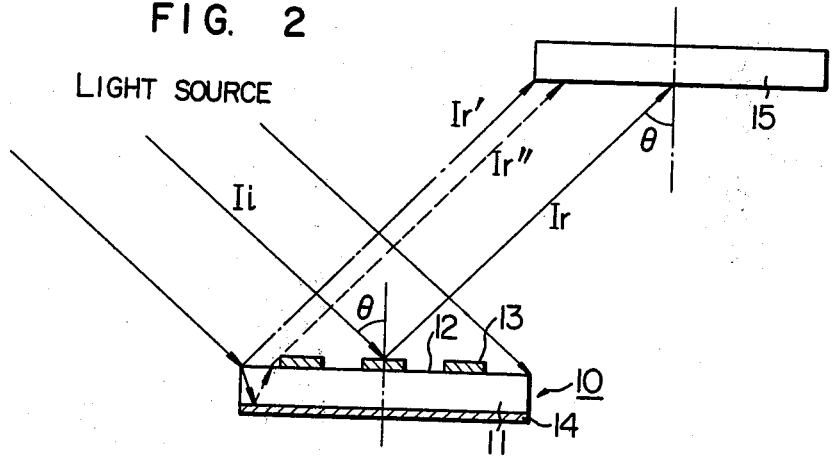
FIG. 2 shows a light-reflection type pattern forming system as an embodiment of this invention.

As shown in FIG. 2, light-reflection type pattern forming system has a light-reflection type mask 10 with a substrate 11 of transparent material such as saphire, glass or quartz. The light-receiving surface 12 of the substrate 11 is permeable to light $I_i$ impinging thereonto with an angle $\phi$ of incidence. A region 13 of a highly reflective material such as aluminum is provided on the surface 12. The layout of the highly reflective region 13 is determined corresponding to the original pattern.

A layer 14 of material such as carbon having a high light-absorptivity is provided on the surface of the substrate 11 opposite to the light-receiving surface 12.

When parallel rays $I_i$ of light from the light source impinge upon such a mask 10 as described above, the reflected component $I_r$ from the highly reflective region 13 has an intensity much higher than the reflected component $I_r'$ from the light-receiving surface of the transparent substrate 11 and the component $I_r''$ reflected from the opposite surface of the transparent substrate 11. In this case, the angle $\theta$ of incidence is, as well known, equal to the angle $\theta$ of reflection and the component $I_r''$ has a very low intensity since it has passed twice through the transparent substrate and therein much attenuated. As a result, the only effective rays of light leaving the mask 10 is the component $I_r$, which contains information about the original pattern.

If an object 15 to be exposed (e.g. semiconductor wafer comprising constitutents 1, 2 and 3, shown in FIG. 1) is placed in the path of the reflected beam $I_r$, as shown in FIG. 2, a desired pattern similar to the original one can be obtained on the exposed object 15.

The exposed object 15 may be a silicon wafer having an exposure surface such as a photoresist layer 3 shown in FIG. 1. In such a case, by exposing the photoresist layer directly to the reflected light, a desired pattern can be obtained corresponding to the component reflected from the reflective region since the reflected component from the highly reflective region has an intensity much higher than those from the other region or since, in a more preferably case where the reflected components from the other region may be regarded negligible, there is only the component reflected from the highly reflective region.

Once a pattern has been formed on the object, it is easy to remove the portions of the oxide film 2 (FIG. 1) corresponding to the desired pattern, through the well-known technique.

It should here be noted that the exposed object is by no means limited to the example mentioned above, but that any suitable object may be employed if it permits the application of the pattern copying technique.

In FIG. 2, the exposed object 16 is placed parallel to the mask 10 and in this case the angle of incidence of the reflected component $I_r$ upon the surface of the object 15 equals that, i.e. $\theta$, of the incident light $I_i$ upon the mask 10. However, the object 15 may also be disposed perpendicular to the path of the reflected component $I_r$. In such a case, the obtained pattern will be somewhat different from the original pattern on the mask 10, as easily understood from the standpoint of projective geometry, and the original pattern must be previously so modified as to give a desired pattern on the exposed object.

Figure 3:
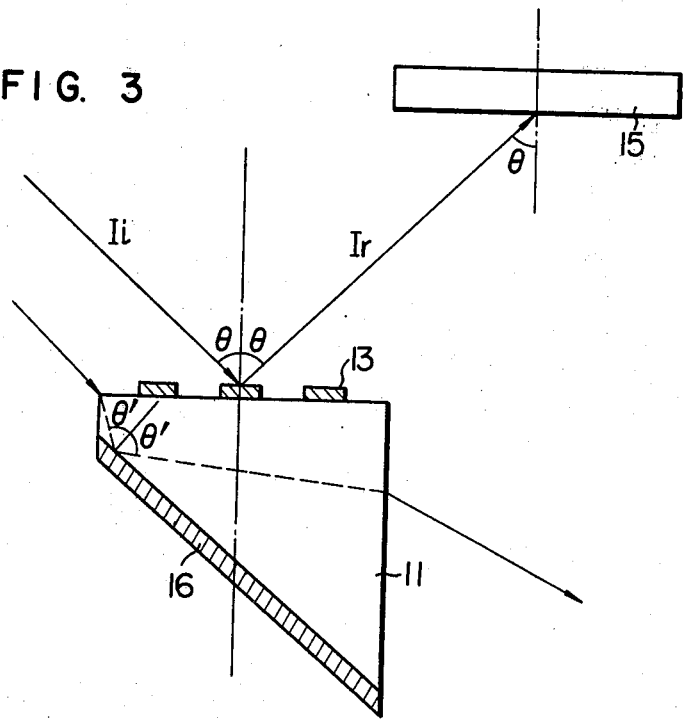
FIG. 3 shows a light-reflection type pattern forming system as another embodiment of this invention.
Figure 4:
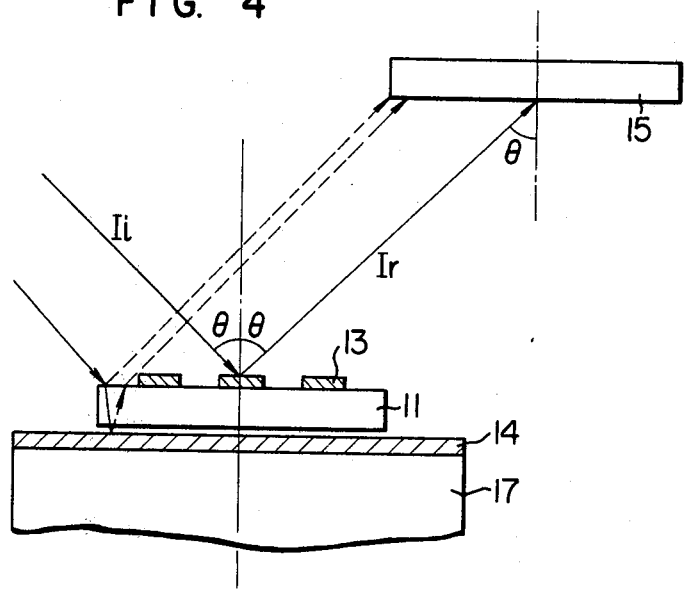
FIG. 4 shows a light-reflection type pattern forming system as yet another embodiment of this invention.
Figure 5:
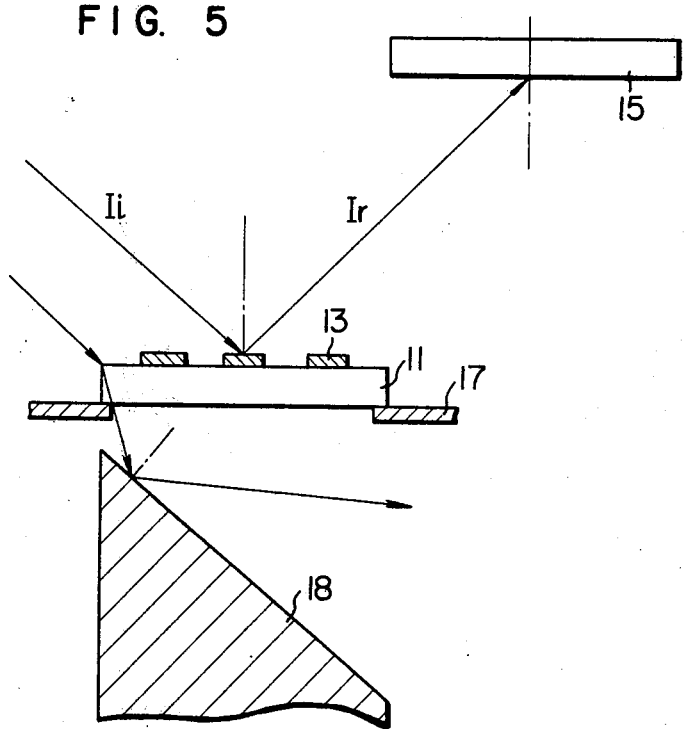
FIG. 5 shows a light-reflection type pattern forming system as still another embodiment of this invention.

In the light-reflection type pattern forming method using a light-reflective type mask having a highly reflective region on a transparent substrate, it is only necessary for the light impinging upon the non-reflective region of the mask to be attenuated through the absorption in the transparent substrate or to be diverted to a direction different from a desired one. FIG. 3 shows a light-reflection type pattern forming system as another embodiment of this invention, in which a layer 16 of a highly reflective material such as aluminum is provided on the surface of a transparent substrate 11 opposite to the light-receiving surface of the substrate 11 in such a manner that the highly reflective layer 16 is not parallel to the light-receiving surface so as to divert the light reflected from the layer 16 to a direction different from a desired one. FIG. 4 shows another embodiment of a mask according to this invention, in which a light-reflection type mask comprising a transparent substrate 11 of saphire and a highly reflective region 13 of aluminum on the substrate 11 is used and a light-absorptive material 14 such as carbon is deposited on the surface of a supporting means or a backup jig 17 of iron on which the mask is rested. FIG. 5, shows a construction according to this invention, in which a mask comprising a transparent substrate 11 of saphire and a highly reflective region 13 of Al thereon is placed opposite to the reflecting surface of a reflecting means 18 of, for example, Al in such a manner that the reflecting surface is not parallel to the surface of the highly reflective surface of the region 13 so as to divert the light component having passed through the mask to a direction different from a desired one.

Figure 6:
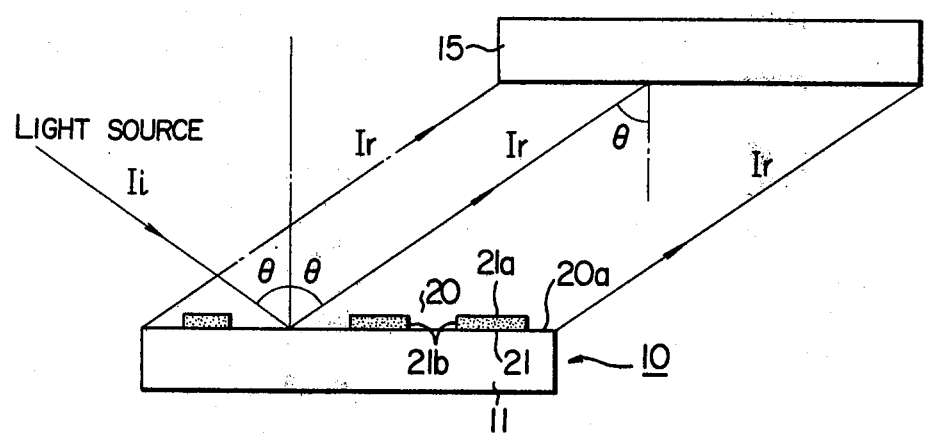
FIG. 6 shows a light-reflection type pattern forming system as a further embodiment of this invention.

The light-reflection type mask according to this invention may be of any construction in which the information about the original pattern is contained in the component of light reflected from the highly reflective region having a shape corresponding to the original pattern. FIG. 6 shows a light-reflection type mask as another embodiment of this invention. In this embodiment, a mask 10 has an aluminum substrate 11. The main surface 20 of the substrate 11, facing a light source is polished into a mirror surface. Light $I_i$ impinging on the mirror surface at an angle $\theta$ of incidence is reflected with a high reflectivity. A layer 21 of a material such as, for example, carbon black, having a high light-absorptivity is disposed on the mirror surface. The surface of the layer 21 serves as a poorly reflective region 21a and the exposed surface of the aluminum substrate 11 functions as a highly reflective region 20a. As described above, the shape of the highly reflective region 20a is determined in view of the desired pattern.

When parallel rays of incident light $I_i$ impinge on the mask 10, the component $I_r$ of the incident light $I_i$ reflected from the highly reflective region has a higher intensity than the other component reflected from the poorly reflective region, or in a more preferable case there is no reflected component other than $I_r$. Accordingly, the component $I_r$ contains the information about the original pattern so that a desired pattern is obtained on the object 15.

FIGS. 8A-I-V and 8B-I-V show the steps of processes for producing a light-reflection type mask such as the embodiment shown in FIG. 6.

The steps of the process shown in FIGS. 8A-I-V will first be described. Aluminum is used as a substrate 11. The surface of the aluminum substrate 11 is polished into a mirror surface by a mechanical method or any other suitable method and a layer 22 of an organic light-sensitive agent (photoresist layer) such as PMMA (polymethylmethacrylate) is applied on the mirror surface. Then, the sensitized layer 22 is irradiated by, for example, electron beams so as to obtain a latent image similar to the original pattern to be copied on the completed mask. After developing processing, the mirror surface 20 is exposed with a portion of the layer 22 to serve as a poorly reflective region left thereon. By implanting argon ions (indicated by arrows Ar) into the thus prepared surface, the remaining organic layer 22 is carbonized to form a layer 21 of a poorly reflective material (carbon black). Thus, a light-reflection type mask 10 is formed of the poorly reflective region 21 and the highly reflective region 20 as the mirror surface of the aluminum substrate 11, both the regions 21 and 20 forming a pattern similar to an original one.

FIGS. 8B-I-V show the steps of another process. According to this process, a photoresist layer 22 such as PMMA is deposited on the mirror surface 20 of a substrate 11 of a highly reflective material such as Al and then the irradiation of the surface structure by, for example, electron beams corresponding to the original pattern and the developing treatment follows to form a mask pattern formed of the remaining portion of the photoresist layer 22 and the exposed surface 20' of the aluminum substrate. It should here be noted that to obtain the same pattern the removed portion of the photoresist layer 22 in the embodiment shown in FIGS. 8A-I-V must have the same pattern as the unremoved portion of the photoresist layer 22 in the embodiment shown in FIGS. 8B-I-V.

Carbon is then vapor-deposited on the surface structure shown in FIG. 8B-III, as indicated by arrows C in FIG. 8B-IV, so as to form a carbon layer 21'. The remaining portion 22a of the photoresist layer 22 and the portion of the carbon layer 21' lying thereon are both removed while the portion of the carbon layer 21' lying on the exposed surface 20' of the substrate 11 is left unremoved. As a result, a highly reflective region 20a is exposed, with a poorly reflective region 21a of the unremoved carbon layer 21 left corresponding to the original pattern. After the above series of steps, a light-reflection type mask can be obtained.

Although the thus obtained mask may be of very high performance in the ordinary application in the field of the art concerned, it may still incur a problem to be solved in the case where the exact copy of a very fine pattern is required. For the poorly reflective layer 21 has a certain thickness and therefore the upper surface of the layer 21 lies higher in level than the highly reflective surface 20a, so that the surface (indicated by 21a in FIG. 6) connecting the upper surface of the layer 21 with the highly reflective surface 20a is to cause an irregular reflection.

Figure 7:
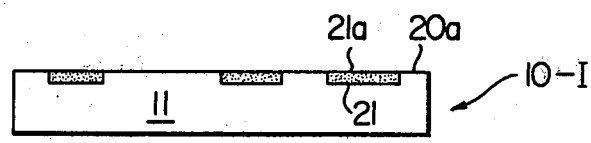
FIG. 7 shows a light-reflection type mask as another embodiment of this invention.

FIG. 7 shows an ideal mask which is free from the above problem and can meet higher requirements in the super-fine patterning technique. As seen in FIG. 7, the poorly reflective layer 21 is so embedded in the substrate 11 that the upper surface of the layer 21 may be at the same level with the highly reflective surface 20a. With this structure, the above mentioned risk of irregular reflection can be completely eliminated.

FIGS. 9A-I-VI and 9B-I-IV show the steps of two processes for producing such a light-reflection type mask 10-I as shown in FIG. 7.

The steps of the process shown in FIGS. 9A-I-VI will be explained. A photoresist layer is deposited on a substrate 11 of aluminum through the same technique as used in the embodiment shown in FIGS. 8A or 8B and the electron beam irradiation and the developing treatment (these steps are hereafter referred to also as pre-treatment) are performed so that the part 22a of the photoresist layer may be left unremoved corresponding to the original pattern and that the surface 20' of the substrate 11 may be exposed.

Grooves 20b having a predetermined depth are cut in the exposed surface 20' of the Al substrate by, for example, etching.

Photoresist material is again applied on the thus prepared surface as a whole and then by, for example, ion-etching the photoresist layer 22' is removed except those portions thereof in the grooves 20b so that a highly reflective surface 22a is exposed.

By the implanting of, for example, argon ions (indicated by arrows $A_r$) into the surface structure thus obtained, the photoresist material 22a' left unremoved in the grooves 20b is carbonized to form carbon black serving as a poorly reflective layer 21. The upper surface, i.e. poorly reflective surface 21a, of the layer 21 is in the same level with the highly reflective surface 20a, both the surfaces 20a and 21a forming a mask 10-I having a pattern similar to the original one.

In the steps of the process shown in FIGS. 9B-I-IV, the steps included in the above defined pre-treatment are the same as those for the embodiment shown in FIGS. 9A-I-VI and therefore the description of the steps are not given here, the equivalent parts being indicated by the same reference symbols throughout the figures. After grooves 20b have been cut in the substrate 11, carbon is vapor-deposited on the grooved surface, as indicated by arrows C in FIG. 9B-III, to form a carbon layer 21'. Thereafter, the photoresist layer 22a with the carbon layer 21' thereon is removed except those portions in the grooves 20b so that a light-reflection type mask 10-I similar to that shown in FIG. 7 is completed.

The light-reflection type masks shown in FIGS. 6 and 7 may be produced by any process other than those shown above and with any suitable material other than Al. The same is also true for the following embodiments.

Moreover, as apparent from the description of the functions of the masks 10 and 10-I shown respectively in FIGS. 6 and 7, the reflected light $I_r$ has only to contain the information about the original pattern, depending on the geometrical relationship between the highly and the poorly reflective regions and therefore the respective regions may be replaced by each other in either mask.

Figure 10A:
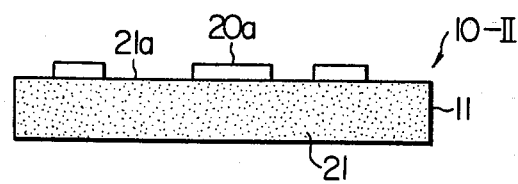
FIGS. 10A and 10B respectively show modifications of the mask shown in FIGS. 6 and 7.
Figure 10B:
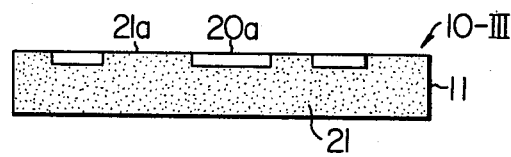

Such region-inverted versions of the masks 10 and 10-I are shown in FIGS. 10A and 10B. A light-reflection type mask 10-II shown in FIG. 10A corresponds to the mask 10 shown in FIG. 6 and a light-reflection type mask 10-III shown in FIG. 10B to the mask 10-I in FIG. 7, the feature common to the masks 10-II and 10-III being that the substrate 11 serves as a poorly reflective material 21 while the aluminum layer or the like is used as a highly reflective material deposited on the surface of the substrate 11. It is clear that the poorly reflective surface 21a and the highly reflective surface 20a polished into a mirror surface can be used to form a pattern similar to the original one. It should here be noted, however, that the pattern obtained by using the mask 10 or 10-I has an inverse relation to the pattern obtained by using the mask 10-II or 10-III. The selective uses of both types of the masks 10 (10-I) and 10-II (10-III) may be effected especially in the case where it is required to form the same pattern on objects whose photoresist layers are of positive and negative types.

Figure 11A:
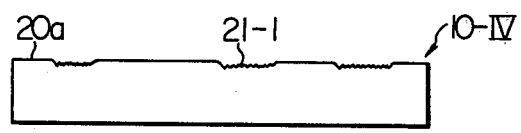
FIGS. 11A to 11C show light-reflection type mask as still other embodiment of this invention.
Figure 11B:
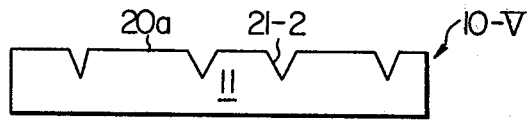
Figure 11C:
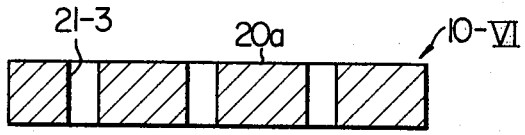

FIGS. 11A, 11B and 11C respectively show light-reflection type maskes 10-IV, 10-V and 10-VI as still other embodiments of this invention.

In the light-reflection type masks 10-IV shown in FIG. 11A, the surface of a substrate 11, except the portion 20a thereof to serve as a highly reflective region having a mirror surface, is rendered rough by etching or any other method (including mechanical one) so as to form a surface 21-1 to cause irregular reflection.

This irregular-reflection region 21, formed of the same material as the highly reflective region, may well be defined as a poorly reflective region (so far as a predetermined direction is concerned). For it is possible to reduce the component of light reflected from the region 21 and directed in the predetermined direction (indicated by, for example, $\theta$ in FIG. 6) to about zero by forming a contimuum of fine striae in the highly reflective surface. It is of course preferable to form the irregular-reflection or poorly reflective region 21-1 in such a manner that there is no reflected component in the predetermined direction.

The light-reflection type masks 10-V and 10-VI shown in FIGS. 11B and 11C have poorly reflective regions which were formed by a mechanical process (including punching) or etching and exhibit a poor reflectivity at least in the predetermined direction.

The poorly reflective region 21-2 of the mask 10-V consists of a group of grooves or blind holes each having a V-shaped profile as shown in FIG. 11B and the poorly reflective region 21-3 of the mask 10-VI consists of a group of through holes made in the substrate 11, corresponding to the desired pattern, as shown in FIG. 11C. In either configuration, the irregular reflection or the reflection of light in directions other than a predetermined one (in which the highly reflective region 20 reflects the incident light) is caused by the side walls of the grooves or the holes.

Figure 12:
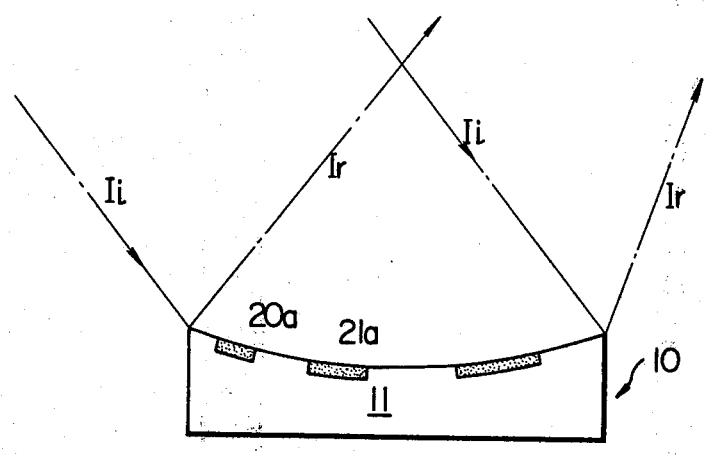
FIG. 12 shows a light-reflection type mask as still another embodiment of this invention, having a concave reflecting surface.

FIG. 12 shows a modification applicable to each of the light-reflection type masks as described above, in which the light-receiving surface is curved (in this modified example, concave with respect to the incident light). If parallel beams of incident light $I_i$ fall on such a mask, the reflected beams are converged or diverged depending on the curvature of the curved surface. In the case shown in FIG. 12, a pattern similar to the original one, formed corresponding to the contrast between the component light reflected from the highly reflective region 20a and that reflected from the poorly reflective region 21a, has a tendency to contract along the traveling path of the reflected rays $I_r$. This suggests that a contracted version of an original pattern can be formed on an object (not shown).

It will be needless to say that if the light-receiving surface of the mask 10 is convex with respect to the incident light, the enlargement of the original pattern may be possible.

The light-reflection type mask according to this invention need not use such a lens system as necessary for the conventional light-transmission type mask, but may also use the system if desired. For example, such a system may be used to converge the diverging beams of light emitted from a point source into parallel beams to be cast onto the mask or to compensate for the reflected light which was a pencil of non-parallel beams before the reflection on the surface of the mask. Incidentally, the embodiment shown in FIG. 12 may be used to produce parallel reflected beams from slightly divergent incident beams, as is understood if the traveling directions of the incident and reflected beams of light, indicated by arrows, are followed inversely.

Figure 13:
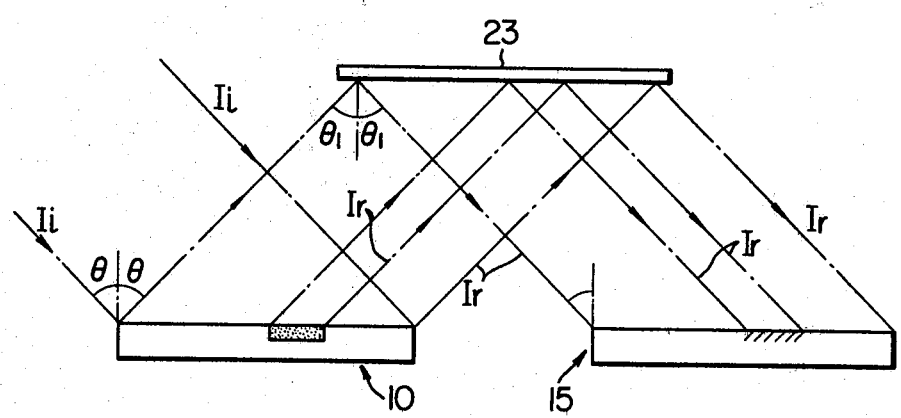
FIG. 13 shows a light-reflection type pattern forming system as a still further embodiment of this invention, in which the path of the light reflected from the highly reflective region is changed.

When an object 15 to be exposed is placed in the path of the reflected light from the surface of a mask (each of the masks shown in FIGS. 6 to 11) mounted in such a geometry as shown in FIG. 6, the pattern obtained on the object 15 is a mirror image of the original pattern. Therefore, a desired pattern is obtained by using an original pattern which is the mirror image of the desired pattern. If a pattern identical with the original pattern on a mask is desired, such a method as shown in FIG. 13 will be recommended. Incident light $I_i$ falling on a light-reflection type mask 10 at an angle $\theta$ of incidence is reflected by the surface of the mask 10 and the reflected component $I_r$ containing the pattern information and leaving the surface of the mask 10 at an angle $\theta$ of reflection is cast on a reflector 23. The reflector 23 is made of aluminum, silver or any other suitable material and the reflecting surface thereof is polished into a mirror surface having a very high reflectivity (without loss). The primary reflected light $I_r$ impinging on the reflector 22 at an angle $\theta_1$ of incidence (in the case shown in FIG. 13, $\theta_1 = \theta$) is reflected at an angle $\theta_1$ of reflection to be secondary reflected light $I_r$. Since the information about the original pattern is preserved intact, a pattern identical in positional relation with the original one is formed on an object 15 placed in the path of the secondary reflected light. Further, if the angle $\theta_2$ of incidence at which the secondary reflected light impinges on the object 15 is selected to be equal to $\theta$, the obtained pattern coincides in dimensions as well as positional relation with the original pattern.

The provision of the reflector 23 leads also to a merit that the mask can be kept at a distance from the object, which permits a larger allowance in the design of the system under concideration. In this sense, more than one reflector may be used if necessary.

According to the light-reflection type pattern forming system according to this invention, the attenuation of the reflected light from the highly reflective region is little so that the intensity of the reflected light is sufficient, the exposure time can be shortened and the conventional restrictions on the wavelength of incident light can be removed. Actually, the light-reflection type mask used in practical application by the present applicant has exhited a reflectivity of more than 90% with respect to the deep ultra-violet light which is completely cut off by the conventional light-transmission type mask and it has also proved that the mask is effective over the entire range of wavelengths of light.

As described above, the light-reflection type mask according to this invention has the following advantages. (1) Since the mask causes little attenuation of the reflected light, the exposure time can be shortened and the exposure efficiency can be improved. (2) Since the mask can be used over the entire range of wavelengths of light, the deep ultra-violet light, which is not utilized by the conventional mask of light-transmission type, can be utilized so that the formation of a micro-pattern for micro-wiring can be effected. (3) Since the use of a lens system is not necessary but optional, the deformation of patterns due to aberration can be eliminated and since the focal depth need not be necessarily taken into consideration, the blur due to misfocalization can be prevented. (4) Since the mask is of reflection type different from the transmission type in which the incident light passes through the substrate of the mask, the damage to the mask by the light never takes place so that the useful life of the mask is very long. (5) Since the thickness of the mask substrate is arbitrary, a sufficient mechanical strength can be assured for every kind of use by increasing the thickness if necessary.

I claim:

1. A light-reflection type pattern forming system comprising:
    a light source producing light along a predetermined path;
    a light-reflection substrate having a main surface facing said light source, said substrate including a highly-reflective pattern region made of a material of high light reflection formed in a selected portion of the main surface thereof, and a poorly-reflective pattern region made of a material of poor light reflection formed in the remainder of the main surface of said substrate to form a predetermined pattern on said substrate, said highly-reflective and poorly-reflective pattern regions being exposed on said main surface and having their surfaces on the same plane, said substrate being disposed on the path of said light source whereby the highly-reflective and poorly-reflective pattern regions are exposed to the light from said light source with a predetermined angle of incidence; and
    an object to be exposed, disposed at a distance from the path of said light source and positioned to receive light reflected from said highly-reflective pattern region on the main surface of said substrate.

2. A light-reflection type pattern forming system as claimed in claim 1, wherein said poorly-reflective pattern region, comprises a layer of transparent material in which said highly-reflective pattern region is embedded and said substrate further has a layer of light-absorptive material provided on the surface of said substrate opposite to said main surface facing said light source.

3. A light-reflection type pattern forming system, comprising:
    a light source producing light along a predetermined path;
    a light-reflection substrate having a main surface, said substrate being transparent and having a highly-reflective pattern region made of a material of high light reflection disposed on a selected portion of the main surface thereof, said substrate being disposed on the path of said light source whereby the highly-reflective pattern region is exposed to the light from said light source;
    an object to be exposed, disposed at a distance from the path of said light source and positioned to receive light reflected from said highly-reflective pattern region on the main surface of said substrate; and
    means disposed on the opposite side of said substrate from said main surface for reflecting light which passes through said substrate in a direction away from said object.

4. A system as claimed in claim 3, wherein said system incorporates therein a supporting means having a layer of a light-absorptive material on at least one of the surfaces thereof, said substrate being placed on said supporting means in such a manner that the surface of said substrate opposite to said main surface thereof facing said light source, faces said layer of said light-absorptive material.

5. A system as claimed in claim 3 wherein a second surface of said substrate is disposed at an angle to said main surface and said reflecting means comprises a layer of reflective material provided on said second surface for reflecting the light having passed through said substrate in a direction other than a direction toward said object.

6. A system as claimed in claim 3 or claim 4, wherein said system incorporates therein a reflector disposed separately from and on the side of said substrate opposite to said main surface thereof facing said light source, for reflecting the light having passed through said substrate in a direction other than a direction toward said object.

7. A system as claimed in claim 1, wherein said poorly reflective region is formed of a compound composed mainly of carbon.

8. A system as claimed in claim 1, wherein said poorly-reflective region of said substrate facing said light source is formed by a surface configuration in said region having a configuration to cause irregular reflection of light impinging thereon.

9. A system as claimed in claim 1, wherein said highly-reflective region is provided with a mirror surface.

10. A system as claimed in claim 9, wherein said highly-reflective region is aluminum.

11. A system as claimed in claim 1, wherein said main surface of said substrate facing said light source is concave so that said desired pattern is copied on said object on a reduced scale.

12. A system as claimed in claim 1, wherein said main surface of said substrate facing said light source is convex so that said desired pattern is copied on said object on a magnified scale.

13. A system as claimed in claim 1, further comprising a reflector positioned to change the path of the reflected light from said highly reflective region, the light reflected from said reflector being cast on said object.

14. A system as claimed in claim 1, wherein said light source emits deep ultra-violet light.

15. A method of producing a graphic pattern from a reflection type pattern mask comprising the steps of:

preparing a reflection type pattern mask including a region of material of high reflectivity and a region of material of poor reflectivity which are exposed on one surface of said mask, whereby a predetermined reflection type pattern is formed by both the regions, both the regions having their respective exposed surfaces which are on the same plane;

irradiating said one surface of said reflection type pattern mask with light from a light source at a predetermined incident angle; and receiving at an exposure object position light reflected at a certain reflection angle from said one surface of said reflection type pattern mask.

* * * * *